(12) United States Patent
Smedt et al.

(10) Patent No.: US 6,702,302 B2
(45) Date of Patent: *Mar. 9, 2004

(54) EDGE HANDLING WAFER CHUCK

(75) Inventors: Rodney G. Smedt, Los Gatos, CA (US); George Coad, Lafayette, CA (US)

(73) Assignee: KLA-Tencor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/836,655

(22) Filed: Apr. 17, 2001

(65) Prior Publication Data

US 2001/0013684 A1 Aug. 16, 2001

Related U.S. Application Data

(63) Continuation of application No. 09/299,783, filed on Apr. 26, 1999, now Pat. No. 6,217,034.
(60) Provisional application No. 60/101,632, filed on Sep. 24, 1998.

(51) Int. Cl.[7] .......................... B05C 13/00; B23B 31/18
(52) U.S. Cl. ...................... 279/106; 118/503; 118/730; 269/20
(58) Field of Search ........................... 279/106; 269/20; 118/500, 503, 728, 730

(56) References Cited

U.S. PATENT DOCUMENTS

| 4,118,058 A | * | 10/1978 | Rahn et al. | 294/64.3 |
|---|---|---|---|---|
| 4,306,731 A | * | 12/1981 | Shaw | 279/106 |
| 4,345,836 A | * | 8/1982 | Phillips | 355/53 |
| 4,445,494 A | * | 5/1984 | Schiele et al. | 269/20 |
| 4,473,455 A | * | 9/1984 | Dean et al. | 118/503 |
| 4,718,681 A | * | 1/1988 | Kakehi et al. | 279/106 |
| 4,903,717 A | * | 2/1990 | Sumnitsch | 118/730 |
| 5,040,484 A | * | 8/1991 | Mears et al. | 118/503 |
| 5,046,909 A | * | 9/1991 | Murdoch | 414/225 |
| 5,280,983 A | * | 1/1994 | Maydan et al. | 294/119.1 |
| 5,421,056 A | * | 6/1995 | Tateyama et al. | 279/106 |
| 5,421,595 A | * | 6/1995 | Cripe et al. | 279/3 |
| 5,511,005 A | * | 4/1996 | Abbe et al. | 364/552 |
| 5,566,466 A | * | 10/1996 | Hearne | 34/58 |
| 5,583,971 A | * | 12/1996 | Lo | 395/117 |
| 5,989,342 A | * | 11/1999 | Ikeda et al. | 118/503 |
| 6,053,982 A | * | 4/2000 | Halpin et al. | 118/730 |
| 6,113,479 A | * | 9/2000 | Sinclair et al. | 451/288 |
| 6,152,507 A | * | 11/2000 | Pirker | 294/64.3 |
| 6,217,034 B1 | * | 4/2001 | Smedt et al. | 279/106 |

FOREIGN PATENT DOCUMENTS

| JP | 124077 A | * | 10/1978 | | 269/20 |

* cited by examiner

Primary Examiner—Daniel W. Howell
(74) Attorney, Agent, or Firm—Smyrski & Livesay, LLP

(57) ABSTRACT

An edge handling chuck which operates to maintain a semiconductor wafer at a desirable orientation while rotating the wafer at high speeds is disclosed. The edge handling chuck consists of a cylindrical plate which holds a silicon wafer using multiple spring loaded edge wafer clamps. Gas passes through a center hole in the cylindrical plate and is dispersed to the atmosphere using multiple pressure relief openings in the cylindrical plate. The purpose of this gas arrangement is to stabilize the wafer due to spinning vortex effects. The cylindrical plate has mounted therein an ertalyte ring which provides an area of angled contact for the wafer. The gas arrangement operates to pass gas to the slight space between the semiconductor wafer and the cylindrical plate, thereby contacting a lower surface of the wafer, and subsequently out of the arrangement using the pressure relief holes. The pressure for the arrangement is chosen to provide sufficient force to flatten the wafer and counter the top pressure caused by the spinning vortex.

20 Claims, 8 Drawing Sheets

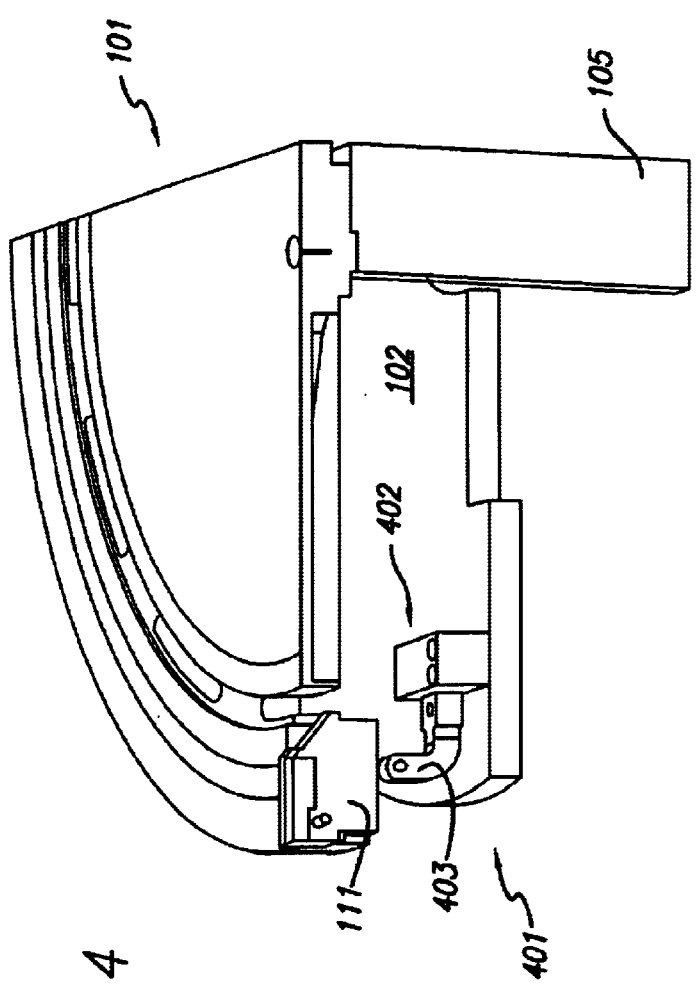
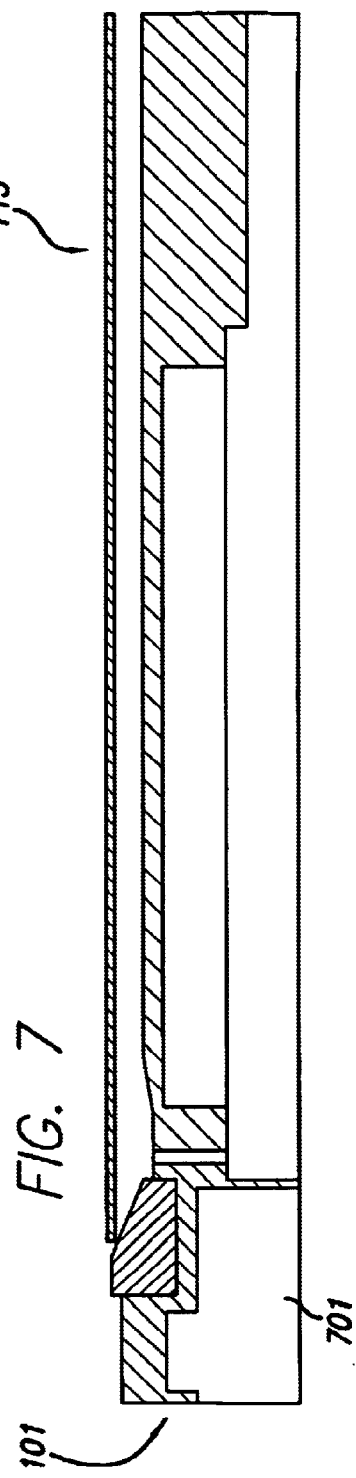
FIG. 4
FIG. 7

EDGE HANDLING WAFER CHUCK

This is a continuation of U.S. patent application Ser. No. 09/299,783, filed Apr. 26, 1999 now U.S. Pat. 6,217,034.

This application claims the benefit of the filing date of U.S. Provisional Patent Application No. 60/101,632, filed on Sep. 24, 1998, pursuant to 35 U.S.C. Sections 111 and 119(e).

BACKGROUND OF THE INVENTION

1. Field of the Invention

The present invention relates generally to an apparatus for holding a semiconductor wafer, and more particularly for holding the edge of the semiconductor wafer in a desirable fashion when rotating the chuck and wafer arrangement at high speeds.

2. Description of the Related Art

Mechanisms used to examine the surface of a semiconductor wafer is commonly known as a handling chuck. Modern examination techniques entail incrementally inspecting the surface of the wafer while the wafer rotates, much like a phonograph needle passes over a phonograph record. As may be appreciated, the greater the speed of rotation, the larger the number of sample wafers which may be examined for a given time.

Prior systems have been employed to handle wafer during the examination process, but these systems have presented various undesirable limitations. For example, systems have been employed which provide a stable surface only below a particular revolution rate, such as 400 rpm. Further, previous designs have used different handling methods which may either grasp the rotating wafer in a way which could potentially damage the wafer or cause excessive motion when the wafer is rotated at high speeds. Excessive motion in either the lateral or axial directions during rotation of the wafer specimen translates into an inability to discern potential faults on the wafer surface. It has not been unusual for movement of the surface to be on the order of tens of microns in the axial direction, and on the order of 100 Hz. Either of these conditions severely diminishes the ability of an inspection system to discover actual defects.

An example of such a known edge handling wafer chucks is one which simply binds the wafer at three or four points and to hold the wafer at these fixed points during rotation. The problem with this design is that the vibration and contamination at excessive rpms causes damage to the wafer and inhibits accurate inspection due to excessive resonance.

Previous systems have also used vacuum chucks, which fixedly bind the wafer to a rotating surface using an air current drawn through the chuck to create a vacuum, thereby virtually fastening the wafer to the surface. The problem with such an arrangement is that during rotation the vacuum pressure may build up to an excessive level, creating prohibitively high forces between the wafer and the chuck surface due to the spinning vortex effects. This vacuum chuck arrangement also has the ability to cause the graininess of the silicon or other wafer components to break down due to the extensive contact between the wafer and the rotating surface.

For current wafer inspection systems it is desirable to maintain a stable surface for rotation speeds in excess of 400 rpm and up to and greater than approximately 1500 rpm. It is further desirable for surface vibration to be on the order of less than 1 micrometer under the aforementioned rotation speeds, with vibration frequency on the order of 100 Hz.

The design of such a system may entail various known materials, including a known plastic such as ertalyte. While it is known that the process of simply placing a wafer on a surface formed of a known plastic such as ertalyte causes the loss of thousands of particles, it is desirable in the spinning chuck environment to minimize the particle loss resulting from exposure of the wafer to the chuck and the rotation of the wafer at the aforementioned speeds.

It is therefore desirable to have an edge handling chuck which has the ability to operate in excess of 1500 RPM, while accurately centering and holding the wafer thereon, affording such features as minimal wafer surface contact, low turbulence resulting from contaminants such as ertalyte particles, and relatively low flutter.

It is therefore an object of the current invention to provide an apparatus for handling a silicon wafer during rotation thereof which permits securing the edge of the wafer without damaging the wafer.

It is a further object of the current invention to provide an apparatus for handling a silicon wafer during the rotation thereof that can operate in the range of and in excess of 1500 rpm while having the ability to both center the semiconductor wafer to within 0.5 millimeters and locate the wafer plane on the order of 12 micrometers.

It is another object of the current invention to provide an apparatus for handling a silicon wafer during the rotation thereof which minimizes particle loss resulting from exposure of the wafer to the apparatus.

It is still another object of the current invention to provide an apparatus for handling a silicon wafer during the rotation thereof which affords minimum surface contact between the apparatus and the wafer and a relatively constant force on the wafer edge.

It is still another object of the current invention to provide an apparatus for handling a silicon wafer during the rotation thereof which has low flutter when subjected to excessive rotation speeds.

SUMMARY OF THE INVENTION

The present invention is an edge handling chuck which operates to maintain a semiconductor wafer at a desirable orientation while rotating the wafer at high speeds. The edge handling chuck consists of a cylindrical plate which holds a silicon wafer using multiple spring loaded edge wafer clamps. The edge handling chuck is integrally supported on a shaft which is rotated using a spindle motor. The edge handling chuck and shaft are fixedly mounted to one another using a fixed plate. The shaft is hollow, thereby permitting passage of gas, such as air, through a center hole in the cylindrical plate. Gas passes through the center hole and is dispersed to the atmosphere using eight pressure relief openings in the cylindrical plate. The purpose of this gas arrangement is to stabilize the wafer due to spinning vortex effects. The anticipated size of the wafer is 300 millimeters, and the diameter of the cylindrical plate is approximately 13.5 inches.

The cylindrical plate has mounted therein an ertalyte ring located outside the pressure relief openings. This ertalyte ring provides an area of angled contact for the wafer. Various numbers of spring loaded edge wafer clamps may be employed, with three such clamps or eight such clamps, for example, used to hold the wafer.

The gas arrangement for the edge handling chuck operates to pass gas to the slight space between the semiconductor wafer and the cylindrical plate, thus into contact with the lower surface of the semiconductor wafer, and subsequently out of the arrangement using the pressure relief holes. These pressure relief holes provide the system the opportunity to expel gas received from the center hole out to atmosphere. The gas system thus provides an air bearing above the surface of the cylindrical plate and below the wafer lower surface. The gas pressure applied is chosen to provide sufficient force to flatten the wafer and counter the top pressure caused by the spinning vortex.

The system further includes a support plate for the purpose of raising and lowering the wafer clamps. The system moves the support plate by applying force using force application member to exert force on a centering device which thereupon pushes the wafer clamp cams, or arms, upward in order to open the wafer clamps.

The edge handling chuck therefore includes a rotatable surface with multiple fasteners, such as clamps, affixed to the rotatable surface. The fasteners are oriented to receive and relatively fixedly hold a specimen, such as a semiconductor wafer, in a desired orientation with respect to said rotatable surface during rotation thereof. The edge handling chuck also includes an extender/retractor system for engaging the plurality of fasteners to receive the specimen and affix the specimen proximate the rotatable surface. The system also has a gas bearing system, wherein the gas bearing system provides gas through the rotatable surface and into a space formed between the rotatable surface and specimen during the rotation thereof, and the gas bearing system comprises a pressure relief system, which is made up of multiple holes in the rotatable surface.

These and other objects and advantages of all of the aspects of the present invention will become apparent to those skilled in the art after having read the following detailed disclosure of the preferred embodiments illustrated in the following drawings.

DESCRIPTION OF THE DRAWINGS

FIG. 4 is a side view of the wafer clamp arrangement with a cutaway view of several system components;

FIG. 7 presents a side cutaway view of the edge handling chuck with a semiconductor wafer loaded thereon;

DETAILED DESCRIPTION OF THE INVENTION

Figure 1:
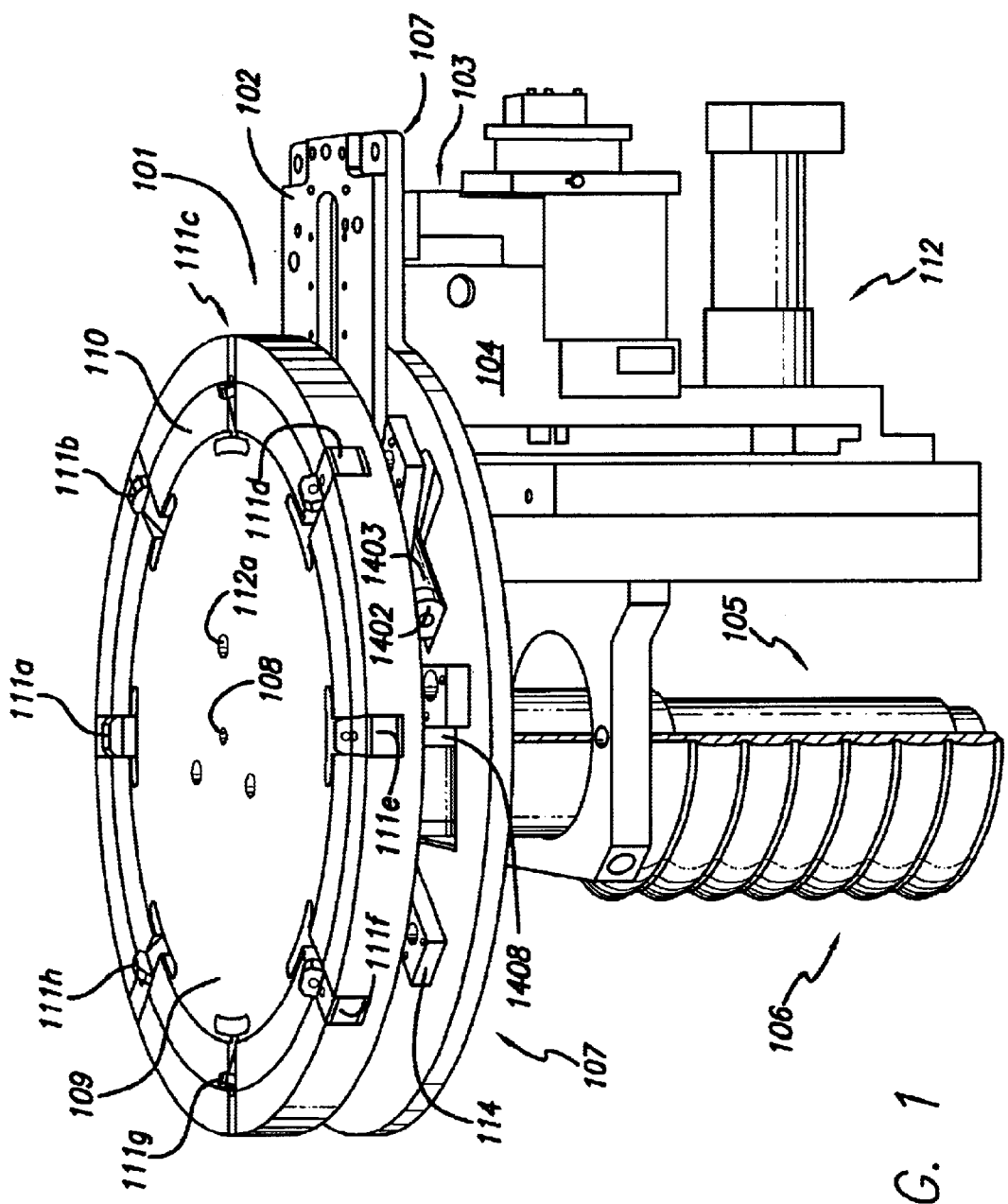
FIG. 1 presents a partial cutaway view of one embodiment of the edge handling chuck in accordance with the current invention.

FIG. 1 illustrates an embodiment of an edge handling chuck in accordance with the current invention. As shown therein, edge handling chuck 100 consists of a cylindrical plate 101 which holds a silicon wafer 115 (not shown) using multiple spring loaded edge wafer clamps 111. The edge handling chuck 100 is integrally supported on shaft 105 which is rotated using spindle motor 106. The edge handling chuck 100 and shaft 105 are fixedly mounted to one another using a fixed plate 107. The shaft 105 is hollow, thereby permitting passage of gas, such as air, through center hole 108 in the cylindrical plate 101. Gas passes through the center hole 108 and is dispersed to the atmosphere using eight pressure relief openings 109a–109h in the cylindrical plate 101. The purpose of this gas mechanization is to provide a securing arrangement for the wafer 115 in addition to the edge handling arrangement, described further below. The anticipated size of the wafer 115 is 300 millimeters, and the diameter of the cylindrical plate 101 is approximately 13.5 inches. The cylindrical plate 101 has mounted therein an ertalyte ring 110 located outside the twelve pressure relief openings 109a–109h. This ertalyte ring 110 provides an area of angled contact for the wafer 115. Mounted on the outer top side of the cylindrical plate 101 are multiple spring loaded edge wafer clamps 111, described below. As may be appreciated from the various figures presented herein, various numbers of spring loaded edge wafer clamps may be employed, with three such clamps 111a–111c or eight such clamps 111a–111h used to hold the wafer 115.

The arrangement shown in FIG. 1 has similar components to other known rotating spindle mechanisms used for wafer inspection. One such system is the SP1 system manufactured by KLA-Tencor Corporation of San Jose, Calif. The majority of the components located above the fixed plate 107 are unique to the present invention.

While the ring 110 is preferably constructed of ertalyte, the remainder of the cylindrical plate 101 may be formed of generally known plastics or compounds with desirable stiffness, including possibly ertalyte.

Three mounting holes 112a–112c are provided for mounting the cylindrical plate 101 to the fixed plate 107 using bolts or other common fastening devices. Clamp 102 is used to clamp and stabilize the outside of the shaft 105. Also provided is rotary encoder 118 (not shown) which provides position sensing for the system during rotation by providing 4096 counts per revolution, thereby properly orienting the rotating chuck and wafer and passing wafer orientation to locations within the system.

Linear stage 104 provides translational capacity to permit a laser (not shown) located above the wafer 115 and cylindrical plate 101 to scan the wafer surface during rotation of the edge handling chuck 100 and wafer 115. The linear stage 104 linearly translates the spindle motor/cylindrical plate arrangement during inspection.

The gas arrangement for the edge handling chuck operates to pass gas to the slight space between the semiconductor wafer 115 and the cylindrical plate 101 and subsequently out of the arrangement using pressure relief holes 109. Pressure relief holes 109 may differ in number, with eight pressure relief holes illustrated in FIG. 1 and twelve pressure relief holes in the embodiment shown in FIGS. 5 and 6. These pressure relief holes 109 provide the system the opportunity to expel gas received from the center hole 108 out to atmosphere. The center hole 108 passes completely through the wafer chuck 100, thereby permitting passage of gas through the center hole 108, with an o-ring (not shown) located at the base of the cylindrical plate 101 to provide a seal between the cylindrical plate 101 and the shaft 105. Gas passes through the center of the shaft 105 having a commutation to fix the vacuum. The pressure is provided so as to stop any vacuum pumping effect associated with handling the wafer 115 with the gap of $12/1000$ of an inch, or 0.5 millimeters.

The gas system thus provides an air bearing above the surface of the cylindrical plate 101 and below the wafer lower surface. The air bearing covers approximately 104 square inches. The recommended pressure for the arrangement shown in FIG. 1 is approximately 16 milliPSI to provide sufficient force to flatten the wafer 115 and counter the top pressure caused by the spinning vortex.

Also illustrated in FIG. 1 is a pivoting mechanism including pivot element 1402, rotating element 1403, and arm 1408 which may be used to engage and rotate the wafer cam clamps 111a–g. These elements form one embodiment of the engagement, rotation, and retraction of the wafer cam clamps 111a–g. As shown in FIG. 1, on initiating movement upward of the support plate 102 to allow for loading of the specimen, the support plate 102 rises and contacts movable plate or centering device 114 having eight protrusions therein which applies force to the eight arms, such as arm 1408, and consequently the eight rotatable wafer cam clamps. Force applied to arm 1408 causes rotation of rotating element 1403 with respect to the fixed pivot element 1402. As described below, the rotatable wafer cam clamp 111a is pivotally mounted within the cylindrical plate 101 to rotate upward and has sufficient spring force acting in a downward orientation to permit the associated wafer clamp 111a to retract to the final and locked position. One of the eight wafer clamps 111 applies force to hold the spinning wafer 115 in place without damaging the periphery of the wafer 115. Each wafer clamp 111, such as wafer clamp 111a, has a receiving portion to receive the wafer 115 therein.

Figure 2:
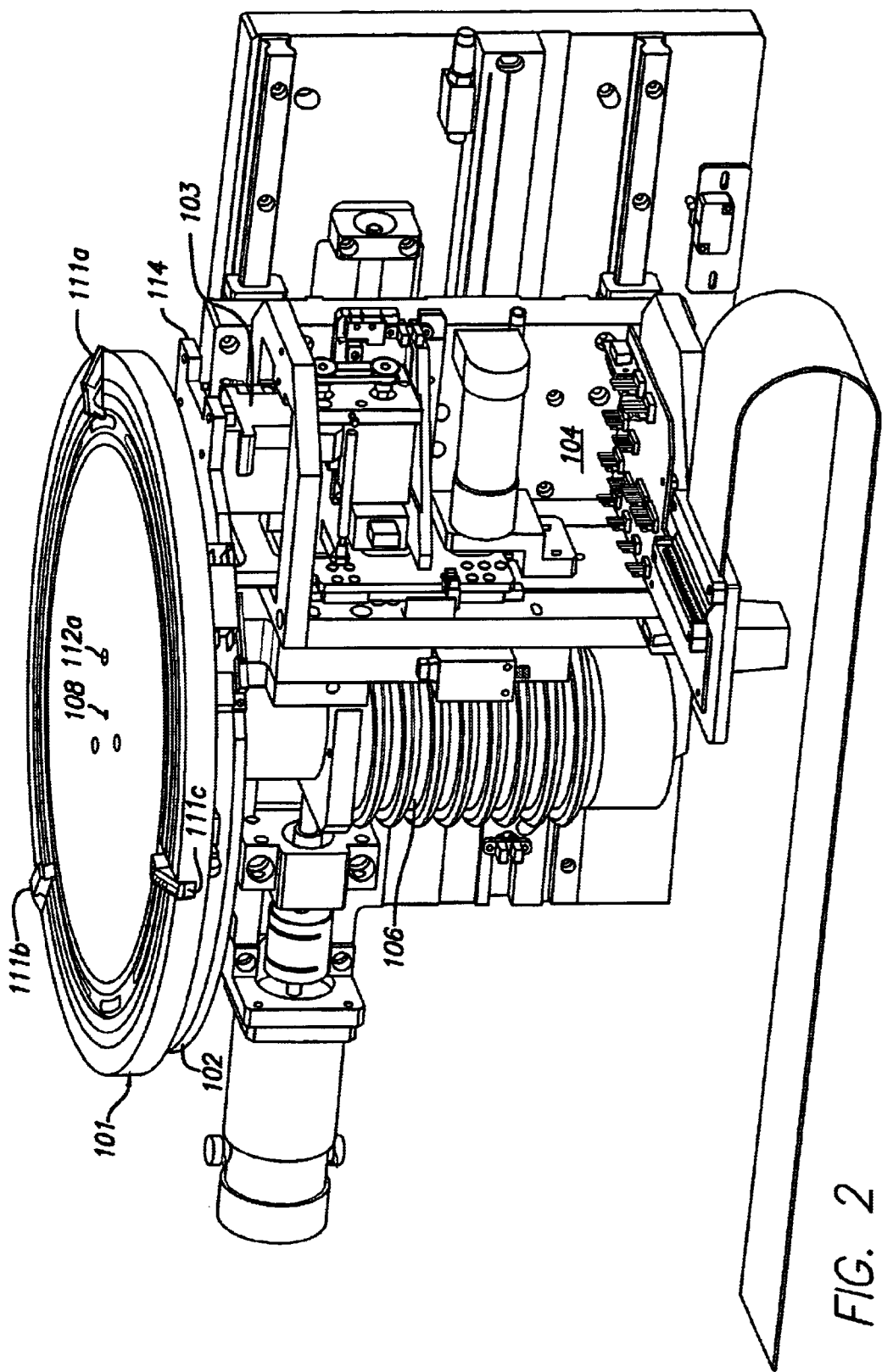
FIG. 2 illustrates an alternate embodiment of the system with the support plate extended in the prepared to load position, or initial mode, with three wafer cam clamps shown fully extended.
Figure 3:
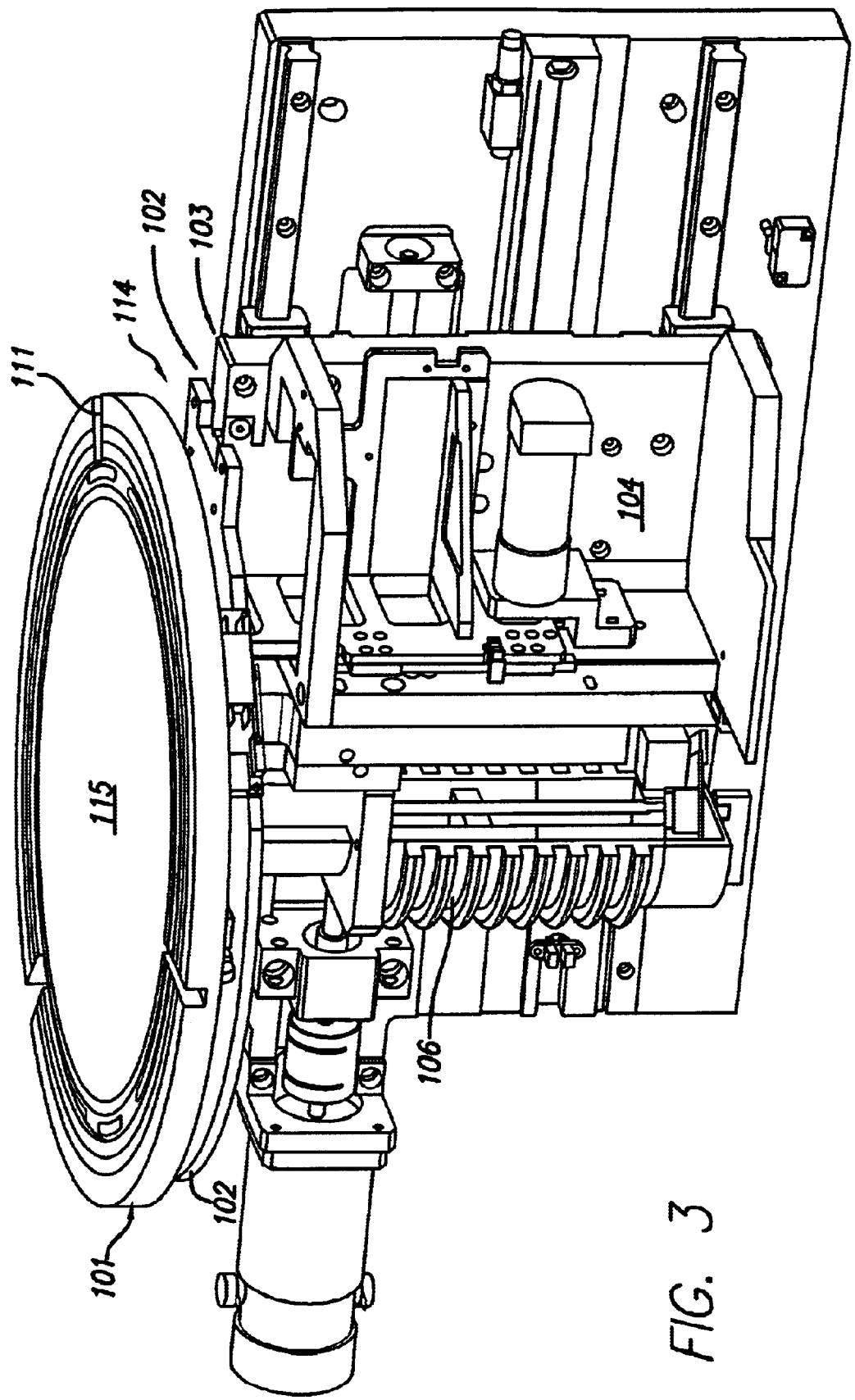
FIG. 3 illustrates a second alternative embodiment of the system in the closed position, or final mode, with a wafer located in position for full rotation.

The illustration of FIG. 2 presents the system with the support plate extended in the prepared to load position, or initial mode, while FIG. 3 illustrates an alternate form of the system in the closed position, or final mode. The system moves support plate 102, by applying force using force application member 103 to exert force on centering device 114 which thereupon pushes the wafer clamp cams 104 up in order to open the wafer clamps 111. The mechanism employed to raise and lower support plate 102 includes force application member 103 coupled with gear motor 112 having a ball bearing on its shaft and a set of linear bearings.

From FIG. 2, the edge handling chuck 100 moves to the load position by using force application member 103 to raise support plate 102, thereby moving the support plate 102 and cylindrical plate 101 together and away from the lower components. The upward movement of the support plate 102 and cylindrical plate 101 permits movement of the arms 113 upward, where each arm 113 is associated and interacts with a respective wafer clamp. This upward movement prompts upward movement of the clamps to an upright and locked position. Positioning of the wafer clamps 111 in the upright and locked position permits an end effector to position the wafer 115 beneath the wafer clamps 111, permitting centering of the wafer 115 while lowering the wafer onto the edge handling chuck 100.

Once the wafer 115 is loaded onto the edge handling chuck 100 and the system is in the initial mode, the system lowers the wafer 115 into final mode or the locked position by retracting force application member 103, thereby lowering both centering device 114 and cylindrical plate 101 toward the remainder of the structure. This lowering of the centering device causes all of the wafer clamps 111 to retract and lower the wafer 115 into its final and locked position, where the wafer chuck 100 is prepared for rotation and the wafer set for inspection. This final position is as illustrated in FIG. 3.

FIG. 1 illustrates a view of the current system with a cylindrical plate having eight wafer clamps located thereon. The system shown therein is in the down, or locked, position. Raising of the support plate 102 in this arrangement similarly raises center device 114, having eight protrusions formed therein, or a number equal to the number of wafer clamps on the cylindrical plate. The wafer clamps 111 are again spring loaded to retract once the wafer 115 has been loaded and the support plate retracted.

A side view of the wafer cam clamp arrangement along with a cutaway view of specific system components for one embodiment of the wafer cam clamp extension/retraction function is illustrated in FIG. 4. As shown in FIG. 4, cam lock/unlock lift mechanism 401 is rotationally stationary and is driven upward by the servo driven cam. Cam lock/unlock lift mechanism 401 is mounted below on the linear stage as shown in FIGS. 2 and 3 and consists of support plate 102 and fixed element 402. Lift lever 403 is fixedly mounted to the fixed element 403, thus providing force to each wafer clamp 111. Spindle 105 is not affixed to the cam lock/unlock lift mechanism 401. Actuation and rotation of a wafer clamp by the cam lock/unlock mechanism 401 is further illustrated in FIGS. 8–11.

Figure 5:
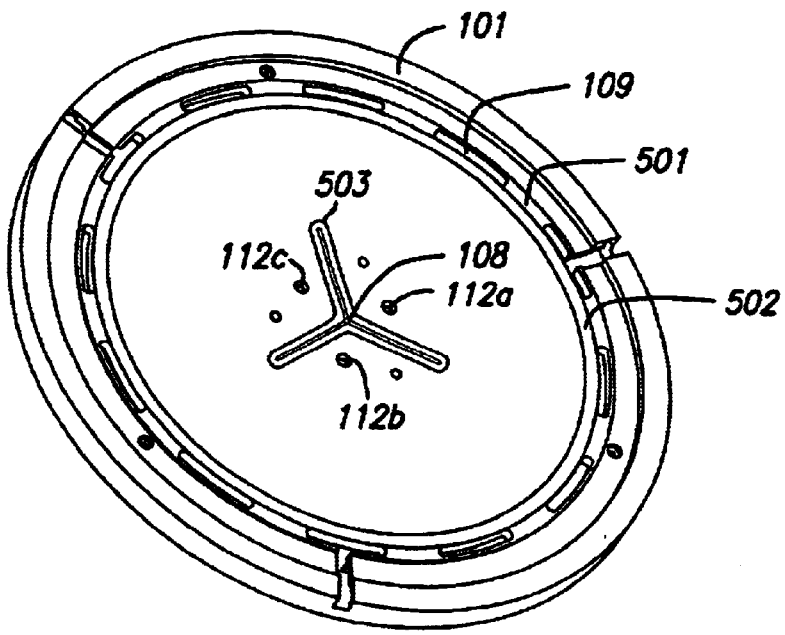
FIG. 5 represents one construct of the cylindrical plate of the edge handling wafer chuck without wafer clamps or the ertalyte ring.
Figure 6:
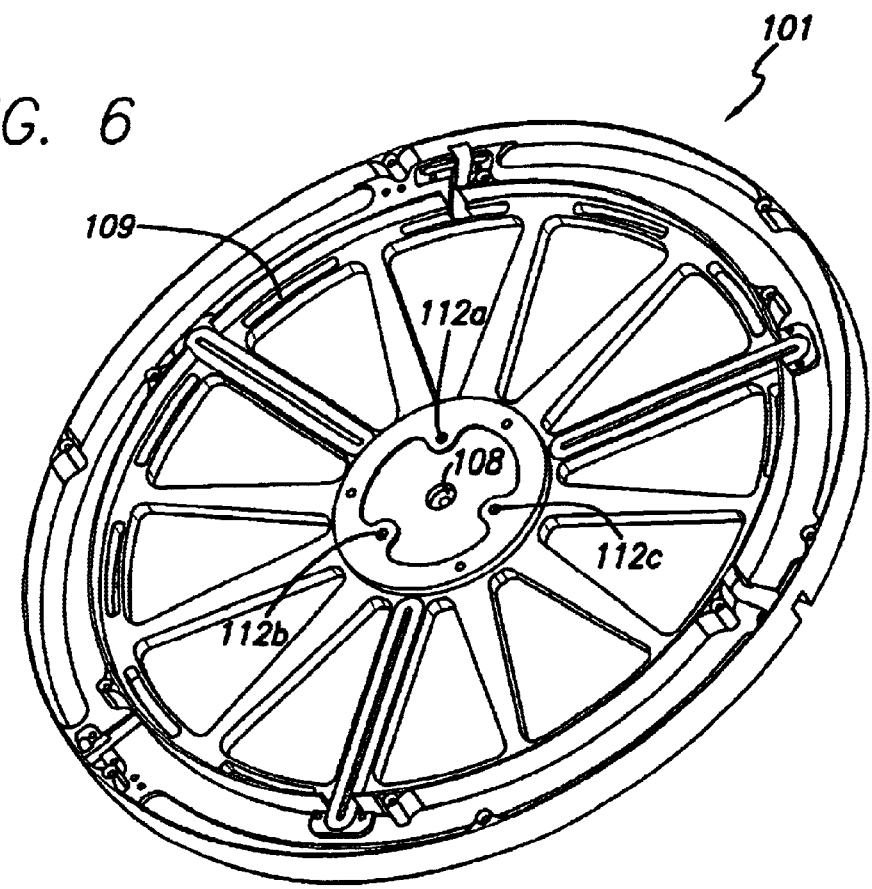
FIG. 6 illustrates the reverse side of the edge handling chuck cylindrical plate of FIG. 5.

One construct of the cylindrical plate 101 of the edge handling wafer chuck 100 is illustrated in FIG. 5. The edge handling wafer chuck 100 of FIG. 5 employs three wafer clamps. The ertalyte plastic used to form the ring 110 is diamond turned and assembled to the cylindrical plate 101 using adhesive transfer tape. The ring 110 has a ½ degree inward taper with the inner diameter of the ring approximately 5.6000 inches from the center of the cylindrical plate 101 and the outer diameter of the ring approximately 6.1800 inches from the center of the cylindrical plate. The stepping of the arrangement illustrated in FIGs. 1 and 5 affords the ability to have minimal surface contact and sufficient space to form an effective air bearing. From the ertalyte ring to the ring 501 having the pressure relief holes 109 located therein the arrangement steps down $50/1000$ of an inch. In other words, the ring 501 is $50/1000$ of an inch lower than the inner side of the ertalyte ring 110. Inner ring 502 is raised $38/1000$ of an inch above the level of ring 501. The embodiment shown in FIG. 5 includes a three pronged channel 503 for improved air bearing performance. Note in FIG. 5 that the ertalyte ring not located in the cylindrical plate 101. FIG. 6 illustrates the reverse side of the edge handling chuck cylindrical plate 101.

The wafer therefore sits in a one degree ertalyte dish, which extends out approximately 13.50 inches in diameter. The present arrangement thereby eclipses the below wafer optics from the laser beam.

Figure 12:
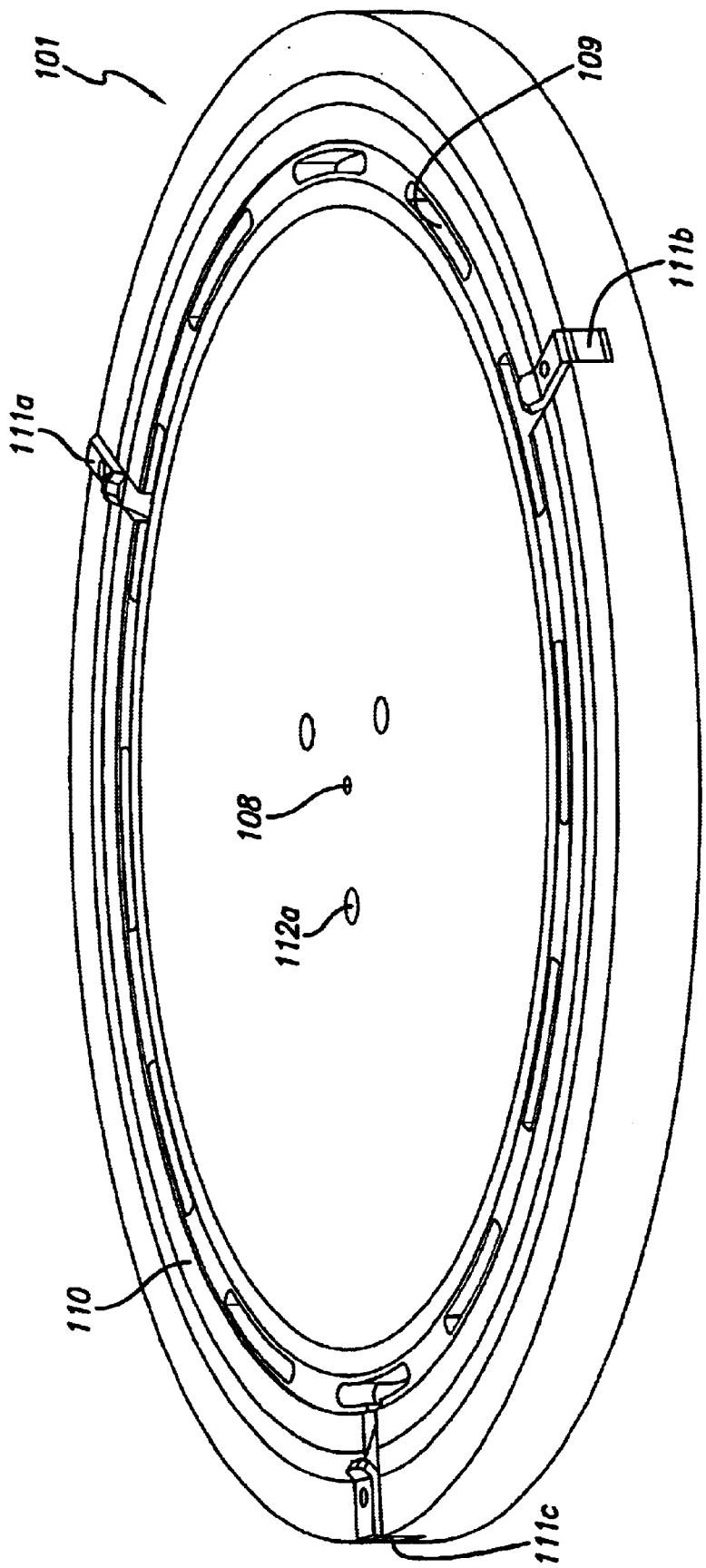
FIG. 12 represents an alternate construct of the cylindrical plate of the edge handling wafer chuck with three wafer clamps located therein.

An alternate construct of the cylindrical plate 101 is illustrated in FIG. 12, wherein three wafer cam clamps 111a–c are located therein. Again, 12 pressure relief holes 109 are illustrated.

Each time the edge handling chuck 100 is loaded or unloaded, the spindle or shaft 105 is oriented to a predefined loading position. The spindle loading position is offset from the spindle axis zero index, which is taught and stored during manufacturing integration.

Full operation of the system is as follows. The spindle or shaft is initially moved into the spindle load position, and the center device 102 moved to the above chuck position, or the initial state or extended position. For the embodiment illustrated in FIG. 1, all arms go from retracted to their fully extended positions and the wafer clamps extended and prepared to receive the wafer 115. The wafer 115 is thereupon placed on the edge handling wafer chuck 100. In this loading state, the wafer chuck does not receive gas through the shaft 105 and the wafer 115 is stationary on the receiving ends of the wafer clamps 111. With the wafer 115 located on the chuck, the center device 102 is moved to the below chuck position, which retracts the arms as well as the wafer clamps 111 to a down position, wherein all but one wafer clamp, such as 111a, are positioned approximately 12 micrometers above the surface of the ertalyte ring 110. The arrangement and the presetting of the wafer clamps 111 affords the ability to maintain a constant force on the wafer edge and permits minimal contact between the wafer 115 and the cylindrical plate 101. Further, the arrangement illustrated keeps the wafer clamps 111 from being pulled open when subjected to excessive rpms.

After the center device is retracted and the wafer brought into place, rotation of the chuck commences and the gas supply source begins supplying gas to the 12 micrometer space between the wafer 115 and the surface of the cylindrical plate 101. The ½ degree canting of the ertalyte of the ring 108 affords minimal space for the gas to escape and minimum contact with the bottom surface of the wafer, and the pressure of the gas places upward force on the wafer, thereby countering top pressure caused by the spinning vortex and minimizing vibration or pumping effects and providing a relatively stable surface for inspection.

During operation, the increase of spin rate of the edge handling chuck 100 causes air to radiate outward, thereby applying force in an outward direction. Without application of gas, the wafer 115 would be pressed against the cylindrical plate 101 during the periods of high rotation speeds. Gas is thus applied into the space to sufficiently raise and stabilize the wafer center and counteract the downward force of the wafer 115 when held in place.

FIG. 7 is a side view of the edge handling chuck 101 with a wafer 115 loaded in position. Pressure relief slot 701 provides relief during high rotation speeds. A 0.012 inch gap exists between the wafer 115 and the surface of the edge handling chuck 101. The contact ring at the edge of the edge handling wafer chuck provides the one degree bevel, thereby affording improved contact between the wafer edge and the chuck.

Figure 8:
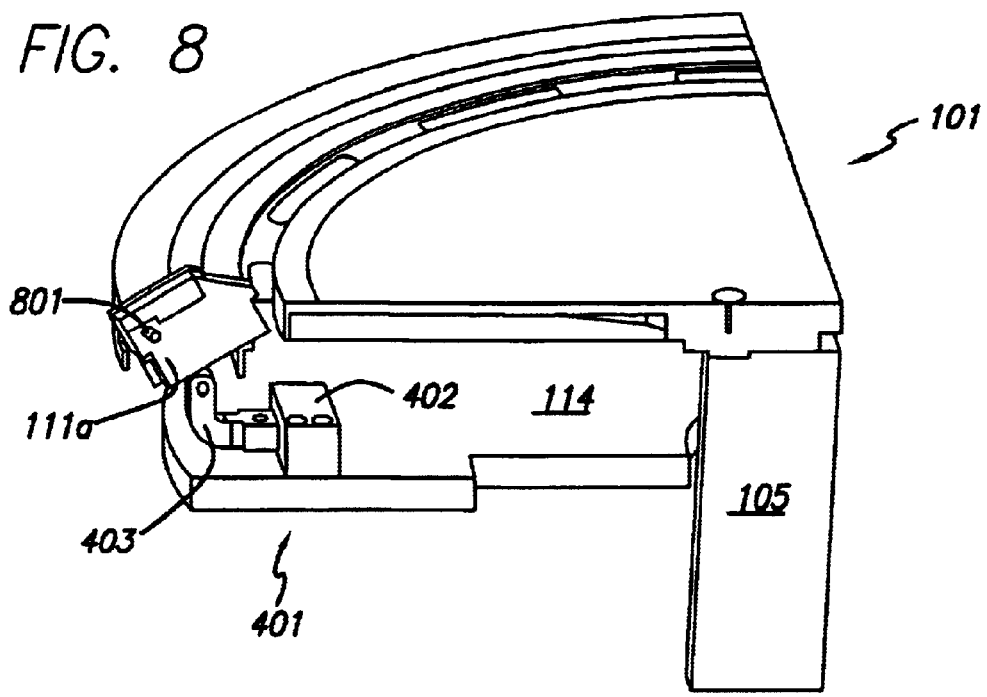
FIG. 8 illustrates an alternate construct of the force producing mechanism used to rotate the wafer cam clamps.

FIG. 8 illustrates a cutaway view of the edge handling chuck 101 with a wafer cam 111a deflected by the cam lock/unlock lift mechanism 401. As shown therein, on initiating movement upward of the support plate 102 to allow for loading of the specimen, the support plate 102 rises and contacts movable plate or centering device 114 which applies force to fixed element 402. Lift lever 403 moves upward, thereby contacting and rotating the wafer cam clamps such as wafer cam clamp 111a shown. Contact between lift lever 403 and wafer cam clamp 111a causes the wafer cam clamp 111a to move upward into the ready to load position as shown. Shaft 801 provides contact between the body of wafer cam clamp 111a and the edge handling chuck 101, and allows the body of the clamp to pivot, raise, and lower.

Figure 9:
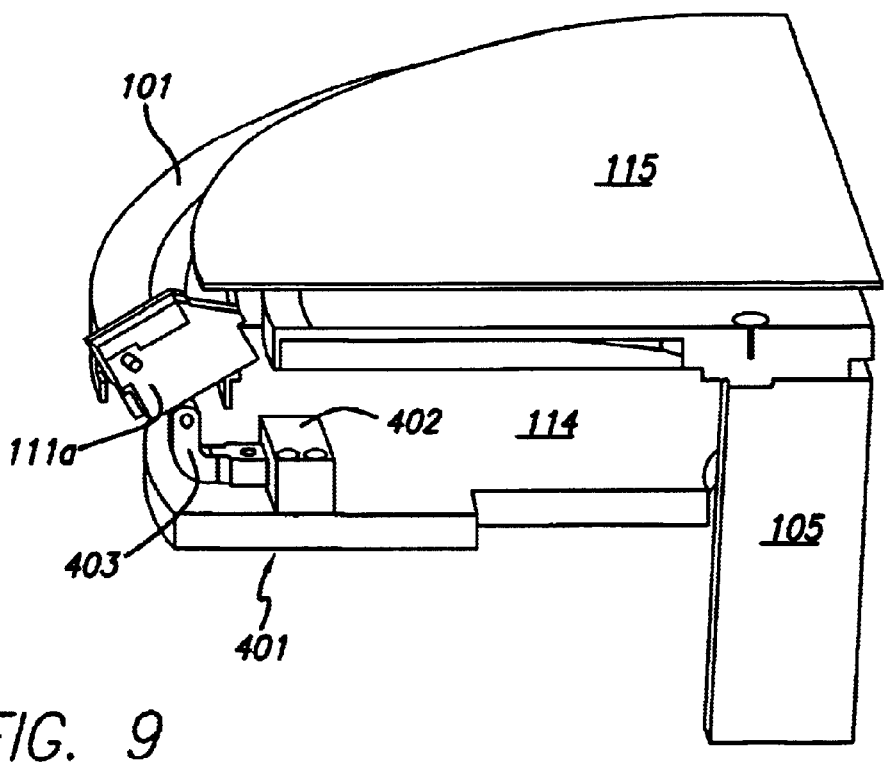
FIG. 9 is the alternate force producing mechanism with a wafer located on a wafer cam clamp.

FIG. 9 illustrates loading of a wafer 115 onto the mechanism, including onto wafer cam clamp 403. The rotating wafer clamp 111a is pivotally mounted within the cylindrical plate 101 to rotate upward and has sufficient spring force acting in a downward orientation to permit the associated wafer clamp 111a to retract to the final and locked position. One of the wafer clamps 111 applies direct force to hold the spinning wafer 115 in place without damaging the periphery of the wafer 115, while the remaining wafer cam clamps apply no direct force to the wafer, but instead apply reaction force to the wafer 115 as shown, thereby holding the wafer 115 in fixed position. Each wafer clamp 111, such as wafer clamp 111a, has a receiving portion in the form of an indentation, as shown, to receive the wafer 115 therein.

Figure 10:
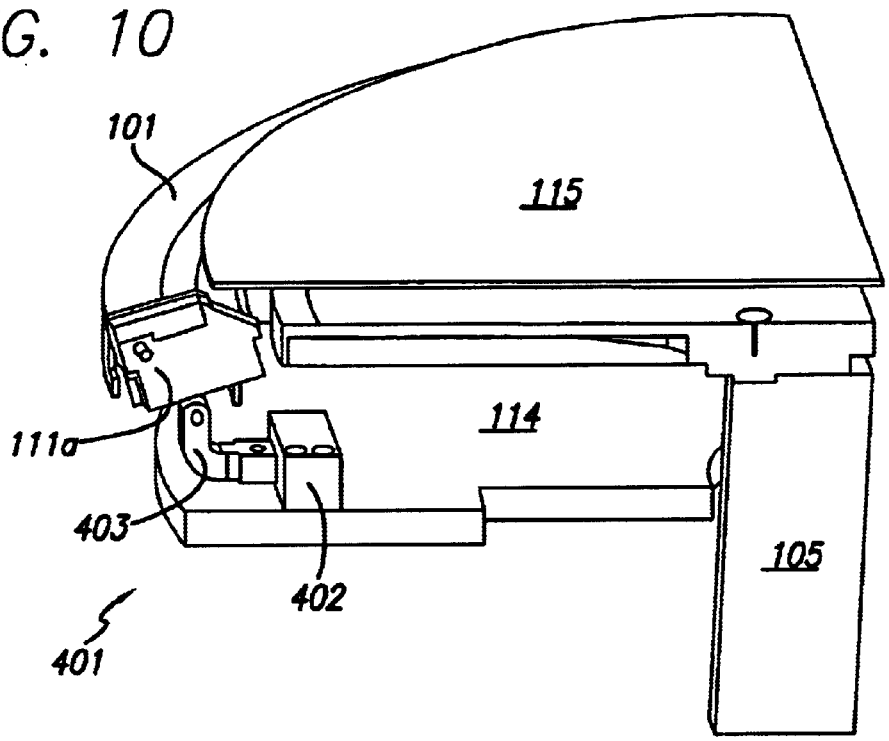
FIG. 10 shows the alternate force producing mechanism partially retracted with a wafer engaging a recess located within the wafer cam clamp.
Figure 11:
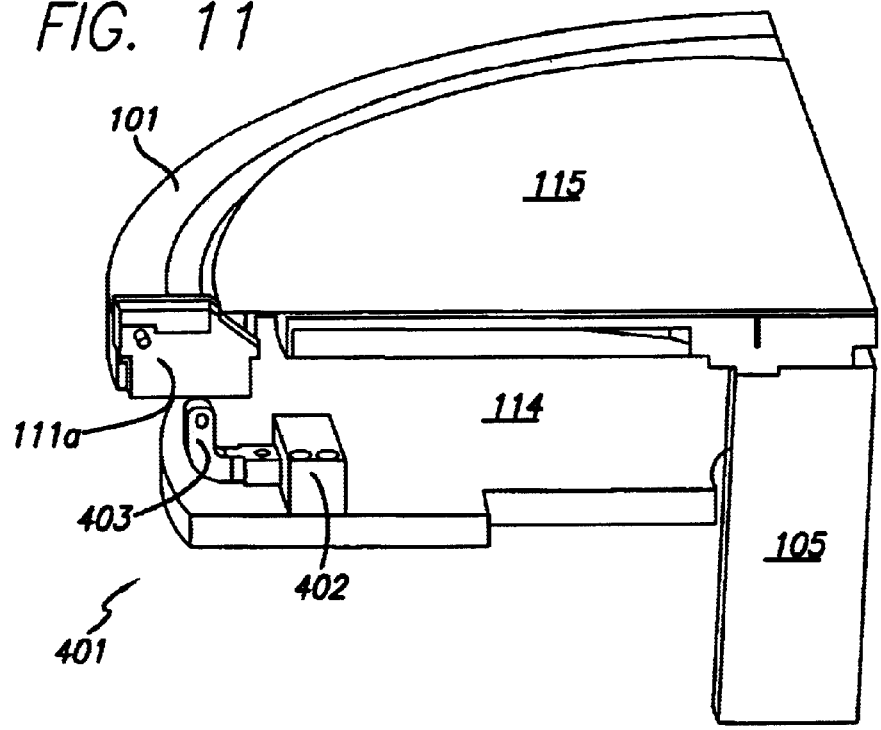
FIG. 11 presents the alternate force producing mechanism fully retracted with the wafer located therein and prepared for rotation.

FIG. 10 illustrates a full handoff of the wafer 115 onto the edge handling wafer chuck 100 and wafer cam clamp 111a coupled with initiation of retraction of the cam lock/unlock lift mechanism 401. In this position, as opposed to the position illustrated in FIG. 9, the wafer 115 is fully resting on the wafer cam clamp 111a, and is in the recess of the wafer cam clamp 111a. The wafer cam clamp 111a has begun to rotate downward, or retract.

From the orientation shown in FIG. 10 the support plate 102, movable plate or centering device 114, and cam lock/unlock lift mechanism 401 are further retracted away from the edge handling wafer chuck 100, causing each wafer cam clamp 111, such as wafer cam clamp 111a, to rotate downward and secure the wafer 115 in place. Lift lever 403 clears from the edge handling chuck and the edge handling chuck 101 is prepared for rotation, as presented in FIG. 11.

The top surfaces of the wafer clamps 111 extend over the top of the wafer 115 by approximately one millimeter. This arrangement affords the edge handling wafer chuck 100 sufficient receiving elements to rest the wafer 115 on the wafer clamps when loading rather than dropping the entire wafer on the surface of the cylindrical plate. Further, this raising and lowering of the wafer clamps 111 affords the system the ability to center the wafer 115 on the surface of the cylindrical plate.

Only one wafer clamp in a three clamp orientation applies force to the wafer 115 during normal operation. The remaining wafer clamps merely hold the wafer 115 in position when force is applied by the single wafer clamp. Thus whether the arrangement comprises three or eight or any other number of wafer clamps, only a single wafer clamp directly applies force while the remaining wafer clamps hold the wafer without applying additional direct force thereto, but instead apply reaction forces to the wafer. The two non-fixed clamps thus come to a fixed stop, while the third applies force via spring tension from a torsion spring. Thus in the retracted position, the two clamps are positioned at hard stop while the third is adjusted to drop further down and lightly grip the wafer.

The wafer clamps 111 are formed of a relatively stiff plastic and have a torsional spring mounted thereto for extension and retraction as described herein. The relatively stiff plastic may be formed of ertalyte, and the critical feature in the construction of such wafer clamps 111 is to maintain a relatively contamination free surface and smooth interaction between each wafer clamp and the wafer 115. Hence the clamp may be constructed of various materials, such as metal or polymer, as long as the portion of the wafer clamp contacting the edge of the wafer is fabricated from a relatively contamination free and wafer edge favorable material, such as plastic or ertalyte.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A spin chuck for use with a spindle, comprising:
   a cylindrical plate having a fluid opening located therein, said cylindrical plate fixedly mounted to said spindle;
   plurality of extendable and retractable clamps fastened to said cylindrical plate;
   plurality of relief holes formed within said cylindrical plate;
   a force producing mechanism;
   a movable plate engageable by said force producing mechanism;
   a centering device engageable by said movable plate; and
   a plurality of arms, each arm affixed to one rotation element.

2. A spin chuck for use with a spindle, comprising:
   a cylindrical plate having a fluid opening located therein, said cylindrical plate fixedly mounted to said spindle;
   a plurality of extendable and retractable clamps fastened to said cylindrical plate; and
   a plurality relief holes formed within said cylindrical plate;
   wherein said plurality of clamps comprises a plurality of spring loaded clamps, and wherein a first portion of said plurality of clamps apply force to said semiconductor wafer and a second portion of said plurality of clamps hold said semiconductor wafer without applying force thereto.

3. The spin chuck of claim 1, wherein said force producing mechanism engages said movable plate which drives the centering device to move said centering device into causing contact with said plurality of clamps.

4. A spin chuck for use with a spindle, comprising:
   a cylindrical plate having a fluid opening located therein, said cylindrical plate fixedly mounted to said spindle;
   a plurality of extendable and retractable clamps fastened to said cylindrical plate; and
   a plurality of relief holes formed within said cylindrical plate;
   wherein said spindle and said fluid opening are constructed to pass a fluid therethrough, thereby entering a space created between said semiconductor wafer and said cylindrical plate, and further wherein excess fluid is expelled from said plurality of relief holes.

5. An edge handling wafer chuck, comprising:
   a relatively flat rotatable surface;
   a plurality of pivoting specimen edge grips fastened to said relatively flat rotatable surface;
   a gas discharge arrangement providing gas through said flat rotatable surface; and
   a support ring mounted to said relatively flat rotatable surface, wherein said support ring and said plurality of specimen edge grips provide the ability for the wafer chuck to maintain a specimen in a relatively fixed orientation during rotation of the chuck.

6. The edge handling wafer chuck of claim 5, further comprising a gas opening, wherein:
   said gas opening permits receipt of gas into a space formed between said specimen and said relatively flat rotatable surface while receiving and disbursing gas; and
   said gas discharge arrangement permits expelling gas from said space to atmosphere, thereby maintaining said specimen at a relatively fixed orientation relative to said relatively flat rotatable surface.

7. A system for retaining a specimen during the rotation thereof, comprising:
   a plurality of fasteners affixed to a rotatable surface, said rotatable surface rotating substantially within a plane, said fasteners oriented to rotate about an axis relatively parallel to the plane and further oriented to receive and relatively fixedly hold said specimen in a desired orientation with respect to said rotatable surface during rotation thereof;
   an extender/retractor system engaging said plurality of fasteners to affix said specimen proximate said rotatable surface; and
   a gas bearing system configured to provide into a space formed between said rotatable surface and said specimen.

8. The system of claim 7, wherein said gas bearing system comprises a pressure relief system, and wherein said pressure relief system comprises a plurality of openings within said rotatable surface.

9. The system of claim 7, wherein said extender/retractor system comprises:
   a force producing device;
   a support plate for receiving force from said force producing device; and
   a centering device proximate said support plate for receiving said support plate and engaging the plurality of fasteners.

10. The system of claim 7, wherein said plurality of fasteners comprises a plurality of spring loaded edge clamps.

11. The system of claim 10, wherein:
    a first portion of said spring loaded edge clamps provide a holding force to said specimen; and
    a second portion of said spring loaded edge clamps hold said specimen without applying force thereto.

12. The system of claim 7, wherein said rotatable surface comprises a mounting ring affixed therein.

13. The system of claim 12, wherein said mounting ring is formed of ertalyte.

14. A device for holding and rotating a specimen, comprising:
    a substantially cylindrical plate rotating substantially within a plane;
    a plurality of clamps affixed to said cylindrical plate, each clamp oriented to pivot about an axis, each axis substantially parallel to the plane, each clamp able to receive an edge portion of said specimen; and
    an extender/retractor mechanism interacting with said plurality of clamps to fix said specimen in a predetermined position; and
    a fluid application system operating to maintain said specimen in a relatively fixed orientation with respect to said cylindrical plate during rotation of said cylindrical plate.

15. The device of claim 14, wherein said fluid application system comprises a plurality of openings within said substantially cylindrical plate.

16. The device of claim 14, wherein said extender/retractor mechanism comprises:
    a force producing device;
    a support plate for receiving force from said force producing device; and a centering device proximate said support plate for receiving said support plate and engaging the plurality of clamps.

17. The device of claim 14, wherein said plurality of clamps comprises a plurality of spring loaded edge clamps.

18. The device of claim 14, wherein:

a first portion of said spring loaded edge clamps provide a holding force to said specimen; and a second portion of said spring loaded edge clamps hold said specimen without applying force thereto.

19. The device of claim 14, wherein said substantially cylindrical plate comprises a mounting ring affixed therein.

20. The device of claim 19, wherein said mounting ring is formed of a contamination minimizing material.

* * * * *